US006322600B1

(12) United States Patent
Brewer et al.

(10) Patent No.: US 6,322,600 B1
(45) Date of Patent: Nov. 27, 2001

(54) PLANARIZATION COMPOSITIONS AND METHODS FOR REMOVING INTERLAYER DIELECTRIC FILMS

(75) Inventors: Richard Brewer, San Jose, CA (US); Thomas J. Grebinski, Boise, ID (US); James E. Currie, Dover Plains, NY (US); Michael Jones, Sunnyvale, CA (US); William Mullee, Portland, OR (US); Ann Nguyen, San Jose, CA (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/064,651

(22) Filed: Apr. 22, 1998

Related U.S. Application Data (60) Provisional application No. 60/043,975, filed on Apr. 23, 1997.

(51) Int. Cl.$^7$ .................................................... B24D 3/02

(52) U.S. Cl. ................................... 51/308; 106/3; 51/307

(58) Field of Search ..................................... 438/693, 692, 438/691, 690, 633, 959; 51/307, 308; 252/79.1, 79.2, 79.4, 79.5; 502/8, 10; 423/338, 335, 339; 106/3

(56) References Cited

U.S. PATENT DOCUMENTS

| 3,170,273 | 2/1965 | Walsh et al. ............................ 51/281 |
| 3,328,141 | 6/1967 | Lachapelle ............................ 51/307 |
| 3,634,558 | 1/1972 | Stober .................................... 264/0.5 |
| 3,715,842 | 2/1973 | Tredinnick et al. .................... 51/281 |
| 3,922,393 | 11/1975 | Sears, Jr. ................................ 427/215 |
| 4,447,632 | 5/1984 | Mallon ................................... 556/470 |

(List continued on next page.)

FOREIGN PATENT DOCUMENTS

| 26 29 709 A1 | 1/1978 | (DE) | ............................... C01B/33/12 |
| 01278413 | * 9/1987 | (JP) . | |
| 62207723 | * 9/1987 | (JP) . | |
| WO 95/24054 | 9/1995 | (WO) | ........................... H01L/21/306 |
| WO 96/38262 | 12/1996 | (WO) | ............................... B24B/1/00 |

OTHER PUBLICATIONS

Bogush, G.H., et al. Preparation of monodisperse silica particles: control of size and mass fraction. *Journal of Non-Crystalline Solids* 104: 95–106 (1988).

Bogush, G.H., et al. Studies of the kinetics of the precipitation of uniform silica particles through the hydrolysis and condensation of silicon alkoxides. *Journal of Colloid and Interface Science* 142:1–18 (1991) (Mar. 1991).

Blaaderen, A. Van, et al. Monodisperse colloidal silica spheres from tetraalkoxysilanes: particle formation and growth mechanism. *Journal of Colloid and Interface Science* 154:481–501 (1992) (Dec. 1992).

(List continued on next page.)

Primary Examiner—Caridad Everhart
(74) Attorney, Agent, or Firm—D. Benjamin Borson; Robert A. McLauchlan, III (57) ABSTRACT

A planarization composition is set forth for chemical mechanical planarization of dielectric layers for semiconductor manufacture. The composition comprises spherical silica particles having an average diameter of from 30 nm to about 400 nm, and a narrow range of particle sizes, wherein about 90% of the particles is within 20% of the average particle diameter. The composition includes a liquid carrier comprising up to about 9% alcohol and an amine hydroxide in the amount of about 0.2 to about 9% by weight. The pH of the composition is in the range of about 9 to about 11.5, and the remainder of the solution is water. The composition has low amounts of metal ions, and the composition is used for thinning, polishing and planarizing interlayer dielectric thin films, shallow trench isolation structures, and isolation of gate structures. The invention also comprises methods for using the planarization composition in the manufacture of semiconductor devices.

59 Claims, 5 Drawing Sheets

U.S. PATENT DOCUMENTS

| | | | |
|---|---|---|---|
| 4,567,030 | 1/1986 | Yuasa et al. | 423/326 |
| 4,775,520 | 10/1988 | Unger et al. | 423/335 |
| 4,842,837 * | 6/1989 | Shimizu et al. | 423/335 |
| 4,861,575 | 8/1989 | Sugoh et al. | 423/339 |
| 4,883,521 * | 11/1989 | Shiizu et al. | 65/17 |
| 4,911,903 | 3/1990 | Unger et al. | 423/335 |
| 4,925,704 * | 5/1990 | Sato et al. | 427/221 |
| 4,959,113 | 9/1990 | Roberts | 156/636 |
| 4,983,369 * | 1/1991 | Barder et al. | 423/338 |
| 5,139,980 | 8/1992 | Nakahara et al. | 502/8 |
| 5,143,867 | 9/1992 | d'Heurle et al. | 437/188 |
| 5,169,491 | 12/1992 | Doan | 156/636 |
| 5,209,816 | 5/1993 | Yu et al. | 156/636 |
| 5,225,034 | 7/1993 | Yu et al. | 156/636 |
| 5,229,316 | 7/1993 | Lee et al. | 437/67 |
| 5,229,326 | 7/1993 | Dennison et al. | 437/195 |
| 5,230,833 | 7/1993 | Romberger et al. | 252/363.5 |
| 5,244,837 | 9/1993 | Dennison | 437/195 |
| 5,264,010 | 11/1993 | Brancaleoni et al. | 51/308 |
| 5,314,843 | 5/1994 | Yu et al. | 437/225 |
| 5,316,978 | 5/1994 | Boyd et al. | 437/203 |
| 5,330,931 | 7/1994 | Emesh et al. | 437/60 |
| 5,340,370 | 8/1994 | Cadien et al. | 51/308 |
| 5,340,765 | 8/1994 | Dennison et al. | 437/52 |
| 5,352,277 * | 10/1994 | Sasaki | 106/6 |
| 5,354,490 | 10/1994 | Yu et al. | 252/79.1 |
| 5,354,712 | 10/1994 | Ho et al. | 437/195 |
| 5,362,669 | 11/1994 | Boyd et al. | 437/67 |
| 5,382,272 | 1/1995 | Cook et al. | 51/293 |
| 5,389,352 | 2/1995 | Wang | 423/263 |
| 5,391,258 | 2/1995 | Brancaleoni et al. | 156/636 |
| 5,391,511 | 2/1995 | Doan et al. | 437/49 |
| 5,407,526 | 4/1995 | Danielson et al. | 156/636 |
| 5,411,909 | 5/1995 | Manning et al. | 437/52 |
| 5,425,930 | 6/1995 | Anderson | 423/338 |
| 5,429,711 | 7/1995 | Watanabe et al. | 216/52 |
| 5,447,874 | 9/1995 | Grivna et al. | 437/40 |
| 5,449,314 | 9/1995 | Meikle et al. | 451/41 |
| 5,460,997 | 10/1995 | Hawkins et al. | 437/53 |
| 5,468,682 | 11/1995 | Homma | 437/195 |
| 5,476,606 | 12/1995 | Brancaleoni et al. | 252/79.1 |
| 5,480,476 | 1/1996 | Cook et al. | 106/3 |
| 5,483,568 | 1/1996 | Yano et al. | 378/44 |
| 5,509,840 | 4/1996 | Huang et al. | 445/24 |
| 5,510,296 | 4/1996 | Yen et al. | 437/200 |
| 5,514,245 | 5/1996 | Doan et al. | 156/636.1 |
| 5,516,346 | 5/1996 | Cadien et al. | 51/308 |
| 5,516,710 | 5/1996 | Boyd et al. | 437/31 |
| 5,516,716 | 5/1996 | Hawkings et al. | 437/53 |
| 5,522,965 | 6/1996 | Chisholm et al. | 156/636.1 |
| 5,527,423 | 6/1996 | Neville et al. | 156/636.1 |
| 5,532,191 | 7/1996 | Nakano et al. | 437/228 |
| 5,534,106 | 7/1996 | Cote et al. | 156/636.1 |
| 5,536,606 | 7/1996 | Doan | 430/5 |
| 5,536,675 | 7/1996 | Bohr | 437/67 |
| 5,540,810 | 7/1996 | Sandhu et al. | 156/636.1 |
| 5,552,638 | 9/1996 | O'Connor et al. | 257/759 |
| 5,552,996 | 9/1996 | Hoffman et al. | 364/468.28 |
| 5,556,801 | 9/1996 | Hawkins et al. | 437/50 |
| 5,561,082 | 10/1996 | Matsuo et al. | 437/187 |
| 5,563,096 | 10/1996 | Nasr | 437/186 |
| 5,576,123 | 11/1996 | Mohri et al. | 430/5 |
| 5,597,346 | 1/1997 | Hempel, Jr. | 451/287 |
| 5,597,443 | 1/1997 | Hempel, Jr. | 156/636.1 |
| 5,597,764 | 1/1997 | Koh et al. | 437/195 |
| 5,599,423 | 2/1997 | Parker et al. | 156/636.1 |
| 5,604,146 | 2/1997 | Tseng | 437/52 |
| 5,607,718 | 3/1997 | Sasaki et al. | 427/97 |
| 5,610,083 | 3/1997 | Chan et al. | 437/21 |
| 5,614,430 | 3/1997 | Liang et al. | 437/45 |
| 5,616,519 | 4/1997 | Ping | 438/626 |
| 5,647,989 | 7/1997 | Hayashi et al. | 210/641 |
| 5,656,175 | 8/1997 | Bossier | 210/727 |
| 5,938,837 * | 8/1999 | Hanawa et al. | 117/68 |
| 6,224,464 * | 5/2001 | Nojo et al. | . |

OTHER PUBLICATIONS

Jelinek, L., et al. Study of the stöber reaction. 1. Properties of colloidal silica spheres prepared via alkoxide hydrolysis. *Langmuir* 8:2152–2164 (1992).

Cook, Lee M. Chemical processes in glass polishing. *Journal of Non–Crystalline Solids* 120:152–171 (1990).

Kolenkow, Robert, et al. Chemical–mechanical wafer polishing and planarization in batch systems. *Solid State Technology* 112–114 (1992) (Jun. 1992).*

Pietsch, G. J., et al., Chemomechanical polishing of silicon: surface termination and mechanism of removal. *American Institute of Physics* 64:3115–3117 (1994).*

Chinnock, Chris. Technology news. *Solid State Technology* 26 (1994).*

Doremus, Robert H. Topical meeting on the science of polishing. *Optical Society of America* Session 1:1–4 (Apr. 1984).*

Kasai, Toshio. Topical meeting on the science of polishing. *Optical Society of America* 1–5 (Apr. 1984).*

Warnock, J. A two–dimensional process model for chemimechanical polish planarization. *The Electrochemical Society, Inc.* 138: 2398–2402 (Aug. 1991).*

Tomozawa, Minoru. Oxide CMP mechanisms. *Solid State Technology* 172–175 (Jul. 1997).*

Sivaram, Srinivasan, et al. Planarizing interlevel dielectrics by chemical–mechanical polishing. *Solid State Technology* 87–91 (May 1992).*

Stöber, Werner. Controlled growth of monodisperse silica spheres in the micron size range. *Journal of Colloid and Interface Science* 26:62–69 (1968).*

Matsoukas, T. Dynamics of growth of silica particles from ammonia–cataylzed hydrolysis of tetra–ethyl–orthosilicate. *Journal of Colloid and Interface Science* 124:252–261 (Jul. 1988).*

Hayashi, Yoshihiro, et al. Ammonium–salt–added silica slurry for the chemical mechanical polishing of the interlayer dielectric film planarization in ULSI's. *Jpn. J. Appl. Phys.* vol. 34 (Feb. 1995).*

* cited by examiner

PLANARIZATION COMPOSITIONS AND METHODS FOR REMOVING INTERLAYER DIELECTRIC FILMS

This application claims benefit of Prov. No. 60/043,975 filed Apr. 23, 1997.

BACKGROUND OF THE INVENTION

I. Technical Field

The present invention relates to a planarization composition which is particularly useful for thinning, polishing and planarizing integrated circuitry deposited on semiconductor wafers which have an inter-layer dielectric material deposited on their surfaces to form insulating dielectric films. The thinning, polishing and planarizing serves to remove a portion of the dielectric film so as to flatten and smoothen the deposited dielectric surface, and further to remove excess deposited dielectric material during the formation of shallow trench isolation structures. The invention also relates to a thinning, polishing and planarizing apparatus and method for carrying out the thinning, polishing and planarizing process to flatten and smoothen the dielectric film and to remove excess deposited dielectric material during the formation of shallow trench isolation structures.

II. Discussion of Related Art

In semiconductor processing, it is common to deposit a thin film of an insulating material, for example a dielectric such as doped or undoped oxides of silicon, over already existing dielectric thin films interspersed with other exposed semiconducting and conducting integrated circuit features such as a semiconductor trenches lined with a thin thermal oxide and high density plasma oxide, tungsten silicide/polysiliconlgate structures or titanium/aluminum/titanium nitride structures. The deposited insulating thin film acts as an electrical isolation layer between semiconductors and conducting pathways adjacent to and under the insulating thin film. The deposited material constitutes what is commonly referred to as a shallow trench isolation structures or an interlayer dielectric insulator. When this process is carried out, a thin coating of the material being deposited to fill, and therefore electrically isolate, the semiconductor and inter-gate and inter-metal gaps is deposited globally on the upper surface of the remaining exposed insulating thin films, semiconducting and conducting pathways. The deposited dielectric material is deposited to sufficiently fill the gaps between adjacent semiconducting gate structures and metal conducting pathways, thus partially planarizing the upper surface.

For shallow trench isolation and gate structures, it is preferable to fill the gaps and continue to deposit the dielectric so that there is an excess amount of dielectric material deposited substantially above the gaps. This process is commonly called a gap-fill process. Depending on the type of integrated circuit there may be from one to three types of dielectric materials deposited to complete the gap-fill process, such as the thermally grown and high density plasma CVD deposited oxides used for shallow trench isolation. Each type serves a unique purpose. However, after this dielectric gap-fill process, the planarity of the resultant gap-filled surface is not planar enough to be used as an imaging plane upon which the next pattern of circuitry is defined by photolithographic techniques. A surface that is not highly planar and that has a high scratch density and surface roughness will yield circuit features of varying degrees of quality that will have direct impact on device performance and yield. This is due to the non-planar scratched and rough regions being "out-of-focus" relative to the planar unscratched and smooth regions. Thus, this non-planar dielectric surface must be planarized and surface roughness and scratches be reduced further prior to carrying out the IC patterning process.

The removal of layers of this nature is generally carried out by a thinning, polishing and planarizing operation utilizing a hard surface of a polishing pad and a polishing slurry which wets the pad and is frictionally moved against the excess deposited dielectric surface to be removed. The slurry generally includes silica particles as the abrasive material along with a liquid carrier. Basically, the silica and the liquid carrier are respectively hard enough so as to abrade away the still unplanarized dielectric thin film. The aforementioned method planarizes by mechanical means only. The result, however, is a planarized surface that has a substantial number of scratches and a surface roughness that is not suitable for the manufacture of integrated circuits which utilize sub 0.3 5-micron geometries. Further, in addition to the polishing and planarizing rates for this method being too low to be production-worthy, this type of thinning, polishing and planarizing slurry is considered too dirty having high levels of potential yield-limiting metal ion impurities incorporated in the liquid carrier and the silica slurry abrasive.

It is well known to combine the abrasive and liquid carrier with a reactive chemical constituent. This method is commonly referred to as chemical mechanical polishing (CMP). In this process, more rapid thinning, polishing and planarizating can occur through utilization of an abrasive material, generally alumina or silica, along with a liquid carrier and a compound which is corrosive or oxidative toward or will dissolve the substrate. For example, U.S. Pat. No. 5,391,258 of Brancaleoni, et al. discusses such a process for enhancing the polishing rate of silicon, silica or silicon-containing articles including composites of metals and silica. The composition includes an oxidizing agent along with an anion which suppresses the rate of removal of the relatively soft silica thin film. The suppressing anion may be any of a number of carboxylic acids. Alumina is used as the abrasive material.

It is also known to utilize another abrasive material, specifically silica of very small size, to polish substrates such as rough cut silicon wafers prior to beginning their processing into integrated circuit devices. As an example, Shimizu, et al., in U.S. Pat. No. 4,842,837, teaches a process for producing fine spherical silica having a particle size of 0.5 m and less. The particles are mono-dispersed whereby polishing of the relatively soft, chemically reactive silicon wafer surface can be carried out to produce a substantially flat wafer surface. The resulting colloidal silica was proposed as a polish for silicon wafers, specifically silicon wafers but not interlayer dielectrics such as doped and undoped thermally grown or CVD deposited oxides of silicon. Further, the resulting colloidal silica had unacceptably high ammonia and alcohol contents that prohibited them from being used broadly in silica wafer polishing and frm being used for interlayer dielectric and shallow trench isolation CMP.

U.S. Pat. No. 5,376,222 discloses the use of colloidal silica in an alkaline solution for polishing a silica film on a semiconductor. The polishing solution includes a cation of an alkali metal, an alkaline earth, or an ammonium ion.

U.S. Pat. No. 3,877,183 discloses the use of precipitated silicates and/or silicofluorides as polishing substances for semiconductor materials. These polishing substances are utilized to polish the semiconductor, namely, silicon.

A very real problem exists with respect to polishing materials such as insulating dielectric films without scratches and sufficiently low enough surface roughness and post-planarization surface and dielectric film cleanliness. Insulating thin films are deposited within the channels which fills the channels but still leaves the dielectric thin film surface not planar enough. Further, insulating thin films are deposited to substantially fill shallow trenches. The trenches are intentionally over-filled and then polished and planarized back to the plane of the filled trench. So, what is commonly referred to as a planarization process, is implemented to remove, layer by layer, the "bumpiness" of the dielectric thin film, and to remove the globally deposited oxide trench over-fill back to the plane of the oxide filled trench.

Today's state of the art planarization process, although at one time was sufficient enough to fully planarize the dielectric surface, is no longer sufficient. Scratches (macro-scratches) and haze (micro-scratches and light-point defects), which were once not considered yield-limiting defects, are considered yield-limiting defects today and today's benign scratches and haze most likely will become more substantial yield-limiting factors with tomorrow's more advanced, higher performance, integrated circuits. Relatively speaking, planarized and polished dielectric surfaces must be smoother, cleaner, scratch-free and more planar than they are today. Particle size distribution and the shape of the abrasive are the two of the most important factors which affect scratch density and haze. Today's abrasives used for dielectric planarization are almost exclusively fumed silica whose particle size distribution and shape cause undesirable surface scratches and haze. The particle size distribution of fumed silica and alumina can range from 24 to greater than 300 percent. More recently, the industry has been testing precipitated silicas, as opposed to fumed silicas, for dielectric CMP. With precipitated silica slurries the surface roughness and scratch levels are substantially improved over fumed silicas but today's commercially available and most widely used are manufactured from sodium silicate or potassium silicate. Sodium and potassium are considered the most dangerous yield-limiting contaminants to integrated circuits during their manufacture and therefore the use of precipitated silicas have not gained industry-wide acceptance. Further, there are other high levels of yield-limiting impurities in precipitated silica slurries such as alkaline earth, transition metal and heavy metal ions that make precipitated silicas undesirable as a thinning, polishing and planarizing dielectric slurry. Because today's fumed silica and alumina slurries are so dirty, an extensive and costly post-thinning and planarizing cleaning process must be implemented to remove only some of the slurry-induced, yield-limiting surface and sub-surface impurities.

At the start of a typical prior art thinning and planarizing (CMP) process, one or more dielectric layers are exposed. After a substantial amount of thinning, polishing and planarization, the bumps and oxide overfill remaining are sufficiently removed so as to produce a planarized surface. With the conventional fumed silica-based thinning and planarizing process, the dielectric surface is planarized while scratches, haze and surface impurities remain on the surface. For instance, the most widely used slurry thins and planarizes with a particle size distribution of 23 to 300 plus percent and impurity levels exceeding 50,000 ppb. The result of the thinning and planarizing process is an unpredictably rough and scratched surface that has unacceptably high levels of surface and sub-surface yield-limiting impurities such as sodium, potassium, aluminum, iron, and chlorides.

Integrated circuit manufacturers have been asking fumed and precipitated silica slurry manufacturers to improve today's slurry particle size distribution and purity but without much success. Although the fumed silica abrasive has higher purity than today's seldom used precipitated sodium silicate slurry, it does not have the narrow particle size distribution that can be achieved with a precipitated sodium silicate slurry. With a sodium silicate slurry, particle size distributions can be less than 10 percent, thus yielding a much improved surface haze and scratch density, but this improved performance is accomplished at a relatively inferior impurity concentration level. Especially for the CMP of shallow trench isolation structures, such as a sodium or potassium silicate slurry has the potential to degrade device yield more substantially than any defects traceable to surface scratches and haze. Thus today's precipitated silica slurries, based on sodium silicate, have not gained substantial market acceptance.

To date, there has not been a satisfactory solution to the future need for improved surface roughness, reduced scratch density and improved slurry purity for interlayer dielectric thinning and planarization.

Today's conventional fumed silica and alumina-based dielectric thinning and planarizing slurries have a broad particle size distribution from ±24 percent to ±300 plus percent. The higher the particle size distribution, the greater the surface roughness and scratches. Integrated circuit manufacturers are finding today that they must reduce particle size distribution because of a future requirement that they use photolithography technology having a shallower depth of focus. Having a requirement for a shallower depth of focus in the future also requires that the surface of the integrated circuit, as it is being manufactured, have improved surface roughness and less scratches. Any one of the above parameters, if not improved, can cause future, more advanced integrated circuits to fail. To date, there has been a substantial effort to reduce the particle size distribution and therefore reduce haze, improve surface roughness and reduce scratch density but without the substantial success required to meet tomorrow's performance requirements (depth of focus) dictated by photolithography.

Furthermore, because of the still high impurity levels in today's conventional fumed silica slurries, it has been shown that they cause defects and circuitry failure. Further, it has been shown that the higher the purity of the slurry, the lower the normalized integrated circuit defect density. Accordingly it would be highly desirable to develop a polishing composition which is of a higher purity in order to reduce the post thinning and planarization integrated circuit defect density.

Because of the above shortcomings of today's conventional silica-based thinning and planarizing dielectric CMP slurry, the industry has been looking for an improved thinning and planarizing system which leads to improved surface roughness scratch density and slurry purity, while maintaining the same degree of safety. Although an alkosol has the particle size distribution and purity levels consistent with the what will be required by tomorrow's more advanced integrated circuit technology, the polishing rates are to low to be production-worthy. Further, the current alkosols contain at least 30 wt percent of alcohol which is a concentration too high to be used safely in an integrated circuit manufacturing plant. Therefore, the current alkosols, once believed to be the answer, suffer from productivity and safety shortcomings.

OBJECTS OF THE INVENTION

The present invention is directed to overcoming one or more of the problems as set forth above.

Thus, one object of the invention is the manufacture of a spherical alkylsilicate particle for chemical mechanical polishing of semiconductor dielectric materials.

An additional object of the invention is the manufacture of alkylsilicate particles for chemical mechanical polishing, which have narrow size distributions.

A further object of the invention is the manufacture of alkosol based alkylsilicate slurries with reduced amounts of alcohols while maintaining low metals content and narrow particle size distribution.

Another object of the invention is the manufacture of alkylsilicate slurries permitting decreased surface roughness, decreased scratches and decreased haze of semiconductor dielectric films.

An additional object of the invention is the development of methods for manufacturing alkylsilicate based slurries having reduced alcohol and high purity for higher planarization rates.

A yet further object of the invention is the development of planarization compositions which are of very high purity with low alcohol content.

A yet additional object of the invention is the development of planarization compositions which are of very high purity with reduced ammonia concentrations.

Another object of the invention is the development of planarization compositions with very low metal contamination.

A further object of the invention is a method for planarizing dielectric semiconductor surfaces with high planarization rates, low within-wafer non-uniformity and low surface roughness.

Yet another object of the invention is the optimization of the polishing process to achieve desired rates of polishing and desired surface roughness, while maintaining a high margin of safety during use.

Another object of the invention is the manufacture of semiconductor devices incorporating the planarization compositions and methods.

Therefore, the invention comprises methods for manufacturing highly purified, low alcohol alkosol-based alkylsilicate slurries made by the alkaline hydrolysis of alkoxysilane precursors in aqueous, alcoholic, basic solutions.

Thus, one aspect of the invention is the manufacture of a spherical alkylsilicate particle for use in chemical mechanical polishing.

An additional aspect of the invention is the manufacture of alkylsilicate particles which have narrow size distributions.

A further aspect of the invention is the manufacture of alkosol based alkylsilicate slurries with reduced amounts of alcohols.

A yet additional aspect of the invention is the development of planarization compositions which are of very high purity with reduced ammonia concentrations.

Another aspect of the invention is the manufacture of alkylsilicate slurries permitting decreased surface roughness of semiconductor dielectric films.

An additional aspect of the invention is the development of methods for manufacturing alkylsilicate based slurries for improved planarization.

A yet further aspect of the invention is the development of planarization compositions which are of very high purity.

Another aspect of the invention is the development of planarization compositions with very low metal contamination.

A further aspect of the invention is a method for planarizing dielectric semiconductor surfaces with high planarization rates, low within-wafer non-uniformity and low surface roughness, while maintaining a high margin of safety during use.

Yet another aspect of the invention is the optimization of the polishing process to achieve desired rates of polishing and desired surface roughness.

Another aspect of the invention is the manufacture of semiconductor devices incorporating the improved planarization compositions and methods.

SUMMARY OF THE INVENTION

This invention comprises new ways of manufacturing ultra-high purity alkylsilicate particles and alkylsilicate slurries having low alcohol content for chemical mechanical planarization (CMP), new compositions for CMP, and semiconductor devices incorporating the use of the new compositions and methods. Alkylsilicate particles are made by the alkaline hydrolysis of alkoxysilane precursors in aqueous solutions. By selecting appropriate conditions of hydrolysis and condensation of silicates into alkylsilicate, it is possible to achieve unexpectedly low surface roughness, few scratches and reduced surface haze at sufficiently high polishing, thinning and planarization rates. Further, the conditions of slurry manufacture can be selected to optimize polishing rates and surface roughness to achieve the desired film quality and throughput of semiconductor wafers during manufacturing. The compositions and methods are valuable in the manufacture of semiconductor devices with high feature density, thereby permitting the manufacture of semiconductor products with increased speed, reliability, and at lower power and cost.

BRIEF DESCRIPTION OF THE DRAWINGS

The invention will be better understood by reference to the figures of the drawings wherein like numbers denote like parts throughout and wherein.

DETAILED DESCRIPTION OF THE INVENTION

This invention provides compositions and methods for chemical mechanical planarization of semiconductor surfaces. The compositions comprise alkylsilicate particles in aqueous suspensions containing an alcohol, water, and a base. The compositions are used with equipment to polish semiconductor dielectric surfaces to achieve films of high surface purity, high within-wafer uniformity, and decreased surface roughness and decreased haze.

I. Alkosol Based Precipitated Alkylsilicate Slurry

As used herein, the term alkosol means an aqueous suspension of alkylsilicate particles made by the hydrolysis of an alkoxysilane under alkaline conditions, in the presence of an alcohol. This invention comprises alkosol slurries for chemical mechanical planarization which comprise precipitated alkylsilicate particles in an aqueous, alcoholic, ammoniacal medium. Embodiments of the compositions also comprise low alcohol and/or low amine slurries which exhibit higher polishing rates and lower within-wafer non-uniformity than higher alcohol and/or amine compositions. The compositions comprise spherical alkylsilicate particles having a alkylsilicate particle concentration of 0.5 to 3 0 weight percent, a weighted average particle diameter which falls within the range from about 0.4 $\mu$m to about 0.03 $\mu$m, and is mono-disperse in that at least about 90 weight percent of the particles have a variation in particle diameter from the average particle diameter of no more than about ±20 %. A liquid carrier comprises up to about 9 weight percent ROH, and an amine hydroxide which is $NR_4OH$ or $NR_2NR_3OH$, where each R is any one of H, $HCH_3$, $CH_2CH_3$, $C_3H_7$ or $C_4H_9$, in the amount of about 0.2 weight % to about 10 weight %, the balance of the mixture being water.

We have unexpectedly found that reducing the alcohol concentration to the range of about 0 weight % to about 9 weight % substantially increases the polishing rates for the slurries of this invention compared to levels obtained using higher concentrations of alcohol. Moreover, further decreasing the alcohol concentration results in an unexpected further increase in polishing rates. Slurries with these lower alcohol concentrations provide higher polishing rates than currently available alkosols.

The following Table 1 shows some of the differences between slurries comprising fumed silica and precipitated silica of the prior art and the planarization composition of the invention.

TABLE 1

Physical and Chemical Characteristics of Slurries for Dielectric CMP

| Variable | Prior Art Fumed Silica | Planarization Composition of the Invention |
|---|---|---|
| Metal Ion Contamination (ppb) | 50,000 | 2000 |
| Particle Size Distribution (%) | 23–300 | 5–20 |
| Abrasive Type | branched-chain agglomerate (non-spherical) | monodisperse spherical |

The ammoniated TEOS alkylsilicate particles of this invention are spherical and monodisperse (of a uniform size and within a specific and limited size range and chemical composition and purity). The particles are used in a slurry to controllably polish hard materials and produce a resultant polished surface which is highly planar, relatively smooth and relatively metal ion free, scratch free and therefore defect-free.

When an hydroxyl amine, such as ammonium hydroxide, is present in the composition slurry mixture at weight percentages between 0.2 and 9.0 weight percent, thinning and planarization rates similar to those obtained using conventional fumed silica and precipitated silica slurries are realized. Unexpectedly however, reducing the concentration of the hydroxyl amine to below about 4 weight % increases the polishing rates substantially above those obtained using slurries with higher hydroxyl amine concentrations. Thus, preferred concentrations of hydroxyl amines are in the range of about 0.2 weight % to about 4 weight %, respectively. These concentrations of amines help to provide a pH of the final composition between about 9 to about 11.5, preferably between about 10 and about 11.5, and more preferably between about 10 and 11.

However, surprisingly, the high polishing rates are achieved with about only one-half the surface roughness levels, measured as the root mean square (rms) in Å, one-tenth the density of scratches larger than 1 $\mu$m long and greater than 1 $\mu$m deep, about ½ the surface roughness, and a substantial reduction of the post-CMP particle and residue levels encountered after thinning with the conventional silica-based slurries.

II. Manufacture of Alkosol Based Precipitated Silica Slurries

The manufacture of the alkosol based precipitated silica slurries of the invention comprise the hydrolysis of a precursor, such as TEOS, in an ammoniacal solution with alkaline pH, and the subsequent reaction whereby the reactive intermediate silicates condense to form alkylsilicate particles. The final compositions of the slurries can then adjusted before use, through the removal of alcohol and raising or lowering the pH of the resultant slurry composition.

A. Alkaline Hydrolysis of Alkoxysilane Precursors

The hydrolysis of alkoxysilane precursors in this invention occurs in an alkaline environment. By way of example only, the discussion which follows describes the reactions wherein the alkalinity is maintained by ammonium hydroxide.

An aqueous solution of ammonium hydroxide has five components: $H_2O$, $H_3O^+$, $OH^-$, $NH_3(aq)$, $NH_4^+$. When combined with a silica precursor such as TEOS and water, there are at least two mechanisms for the hydrolysis, of which those for TEOS are described below:

Reaction 1

$(EtO)_4Si(TEOS) + 4H_2O \longrightarrow Si(OH)_4 + 4EtOH$

Reaction 2

$Si(OH)_4 \longrightarrow SiO_2 + 2H_2O$

Reaction 3 and $(EtO)_4Si + 4OH^- \longrightarrow Si(OH)_4 + 4EtO^-$

Reaction 4

$EtO^- + NH_4^+(or\ H_3O^+) \longrightarrow EtOH + NH_3\ (or\ H_2O)$

Reaction 5 and $Si(OH)_4 \longrightarrow SiO_2 + 2H_2O$

At this point, the components in the system are $H_2O$, $(EtO)_4Si$, $H_3O^+$, $OH^-$, $NH_3(aq)$, $NH_4^+$, EtOH, and $SiO_2$. The above reactions represent only possibilities for the formation of the alkylsilicates of the invention. Other chemical reactions and theories may also result in the production of alkylsilicates from the precursors, and all are considered to be part of the invention. Other alkoxysilane precursors are well known in the art, and any of them are suitably used in this invention. The only criterion for selecting other alkoxysilane precursors is that the alcohol liberated during hydrolysis be compatible with the semiconductor dielectric and other features, such as conductive metal lines and relatively safe for use in an integrated circuit manufacturing facility. Even precursors with incompatible alcohols can be used in this invention if the alcohol can be removed to the desired degree after the hydrolytic and condensation reactions have taken place.

In accordance with a particularly preferred embodiment of the invention, the materials utilized are all of ultra-pure quality whereby the suspension has a total metals content of no more than about 20,000 parts per billion by weight, preferably no more than about 2000 parts per billion by weight, and more preferably, no more than about 500 parts per billion by weight. This is particularly useful in the semiconductor processing industries since even small amounts of metal ions in dielectric films can cause errors in devices thereby reducing device reliability and yield.

B. Manufacture of Alkylsilicate Slurries

The methods of formulating the silica particles involve the alkaline hydrolysis of an alkoxysilane precursor and the condensation of the silicate intermediates to form $SiO_2$ and the resulting alcohol. Generally, any alkoxysilane precursor can be used, but tetraethylorthosilicate (TEOS) is the preferred precursor. Additionally, the hydrolysis reaction can be catalyzed by raising the pH to above about 7 using any convenient, metal-free base solution. However, ammonium hydroxide is preferred. The resulting solution comprises alcohol, ammonia, and water. The products formed by the reaction include the silica particles of the desired size, ammonia, ammonium ions and the alcohol corresponding to the alkoxysilane used. What results is a suspension of spherical silica particles in an alcoholic ammonium hydroxide solution.

The reactants and reaction conditions can be varied. For example, the TEOS can be replaced with any tetraalkylorthosiloxane, wherein the leaving group is compatible with the manufacturing processes and the final products. By way of example only, the alkyl groups can comprise methyl, propyl or butyl moieties. If this is done, the product is not ethanol but instead is the corresponding alcohol. It is not necessary that the precursor have four identical alcoholic leaving groups. Thus, methylethylbutylpropylorthosiloxane is suitable in any of its structural isomers. Similarly, many other precursors with appropriate combinations of alcoholic leaving groups can be used in this invention.

Generally, the final alcohol constituent of the slurry may be from about 0 weight % up to about 9 weight %. However, for certain applications, it is desirable for the alcohol concentration to be reduced to lower than about 4 weight %. Reducing the alcohol content of the slurry not only results in increasing polishing rates, but unexpectedly improves the planarity of wafers, as reflected in decreased % within-wafer non-uniformity. As a general method, the concentration of alcohol in the final composition can be adjusted by evaporation or by ultrafiltration (UF). If TEOS is used as a silica precursor, the resulting alcohol (ethanol) can be evaporated by heating during the slurry manufacturing step. Furthermore, other alcohols with low vapor pressure can be removed by evaporation. However, for both ethanol and alcohols with higher vapor pressures than ethanol, other methods such as ultrafiltration can be used. It is desirable to use a UF system which is resistant to corrosion by the chemicals used. By way of example only, the Graver UF system is made of titanium oxide and type 316 stainless steel, which are relatively resistant to corrosion, and is relatively non-contaminating.

It is generally desirable to allow the alkylsilicate particle formation steps to reach completion before removing the alcohol and amine. The remainder of the composition is water, preferably of ultra-high purity (containing no more than about 5 parts per billion). It is desirable for the total amount of water to not exceed about 70% by weight.

The ammonium hydroxide can be replaced by potassium hydroxide or compounds of the formulas $NR_4OH$, and/or $NR_2NR_3OH$ where each R is any one of $CH_3$, $CH_2CH_3$, $C_3H_7$ or $C_4H9$. The amine hydroxide constituent of the nature defined above will usually be present in the amount from about 0.2% to about 9 weight %. It is preferable to have reduced ammonium hydroxide levels, typically in the range of about 0.2 weight % to about 4 weight %. Generally, the ammonium hydroxide can be removed using ultrafiltration or evaporation methods. After removal of a first base, the pH can be adjusted by adding a second base to the slurry. This permits the removal of ammonium hydroxide, which in some applications can be undesirable, and replacing it with potassium hydroxide or other suitable bases to keep the pH in the desired range.

In accordance with the present invention, the pH is adjusted to be within a range from about 9.0 to about 11.5, preferably between about 10 and about 11.5, and more preferably from about 10 to about 11 This pH range provides the necessary ammonia contents necessary to achieve favorable thinning and planarizing rates. It is not desirable to make the composition too neutral (pH about 9.0 or less) or too basic (above about 11.5), because the thinning and planarizing rates decrease to unacceptably low levels.

By carefully adjusting the pH of the alkosol slurry, one can optimize the rate of removal of dielectric materials with respect to the ultimate surface roughness achieved by the planarization process required for integrated circuit manufacture. We have found that by adjusting the pH and alcohol content, fine gradations in polishing rates and surface roughness can be achieved (see Examples 6–7, and 9–10 below). This sensitivity of polishing rate and surface planarization was not appreciated by any of the prior art methods using an alkosol based slurry. Suitable acids which may be used to adjust the pH include acetic acid, nitric acid, citric acid, hydrochloric, carboxylic, acetylsalicylic or sulfuric acid.

Generally, higher rates of dielectric removal result in greater surface roughness. Generally, it is preferred that the amount of $NR_4OH$, alcohol, alkylsilicate content and the pH are selected such that surface polishing rates of dielectric materials are, for BPTEOS, above 500 Å/min to about 15,000 Å/min, preferably between about 3000 Å/min and about 15,000 Å/min, and for thermal oxide, the typical polishing rates are between about 500 Å/min and about 10,000 Å/min, preferably between about 1500 Å/min and about 10,000 Å/min. The desired root mean square surface roughness is in the range of below about 20 Å, preferably below about 10 Å, and more preferably, below about 5 Å.

II. Use of Ammoniacal Alkylsilicate Slurries for CMP

In accordance with another embodiment of the present invention, a pad which is wet with the above planarization composition is set forth. Additionally, another embodiment of the invention is a method of planarizing a substrate having an insulating surface coating to remove the coating. The method comprises positioning the planarization composition set forth above between a pad and the surface coating and rubbing the pad against the surface coating until the surface coating has been removed.

A. Formation of Electrically Isolated Gate Structures

Yet another embodiment of the invention is a method for electrically isolating gate structure structures. By way of example only, a thin 50 Å–200 Å silicon dioxide layer is grown globally over a partially completed integrated circuit.

Next, a thin film of polysilicon is deposited onto the thin, thermally grown, gate oxide. Further, a silicide film is deposited globally onto the polysilicon thin film. The silicide can be any suitable silicide, and includes, by way of example only, titanium silicide, tantalum silicide, and tungsten siuicide. The three grown and deposited thin film layers form the material needed for what is referred to as a gate structure. Next, the surface is patterned with photoresist, etched, and stripped, leaving behind very small sub-Micron sized islands of gate structures. On a typical microprocessor 0.5 by 0.5 inches per side, there may be as many as 10,000,000 gate structures. Further, the regions between the islands of the gate structures are filled with what is commonly referred to as an interlayer dielectric insulator. The dielectric insulator fills the gaps and electrically insulates one gate region from another. After the gap filling process, the integrated circuit surface is smoother and more planar because the regions between the gate structures have been substantially filled with a dielectric such as a doped or un-doped oxide of silicon. A planarizing composition as set forth above is positioned between the inter-layer dielectric surface and a pad. The pad is rubbed against the inter-layer dielectric surface sufficiently to thin and planarize any microscopic bumps on the wafer surface.

B. Manufacture of Interlayer Dielectric Materials.

In another embodiment of the invention, devices containing interlayer dielectric materials, metals, and barrier materials are manufactured by providing a substrate with a dielectric layer, such as by way of example only, a CVD oxide, then providing a patterned photoresist layer, wherein the first dielectric layer is partially exposed. Then, the dielectric surface is etched to form one or more small holes in the dielectric layer, the etching step accomplished, by way of example only, using plasma etching, followed by a photoresist stripping step. Subsequently, a barrier layer is deposited, followed by the deposition of a metal layer. Then, the surface is planarized and thinned to remove excess metal and barrier layer, thus exposing the dielectric layer and the filled holes.

C. Shallow Trench Isolation

To manufacture shallow trench isolation structures, a substrate of epitaxial or bulk silicon is coated with a silicon nitride CMP stop layer. Subsequently, the stop layer is patterned with photoresist, leaving the surface at least partially exposed, followed by an anisotropic plasma etch step of both the stop layer and the underlying substrate, forming at least one small hole. A thin layer of thermal oxide is grown to coat the inside sidewalls and bottoms of the holes, followed by the deposition of a layer of dielectric material, which substantially fills the holes. The excess dielectric material, above the plane of the first surface is then thinned and substantially planarized using CMP methods of this invention.

D. Planarization Methods

Operating in accordance with the invention, any dielectric material, silicide or barrier layer can be planarized using the compositions of this invention. By way of example only, such common dielectric materials as Boron-Phosphorous-doped Silicate Glass (BPSG), Phosphorous-doped Silicate Glass (PSG), Phosphorous-doped Tetraethylorthosilicate (PTEOS), Thermal oxide, Tetraethylorthosilicate (TEOS) oxides, Plasma Enhanced Tetraethylorthosilicate (PETEOS) oxides and high-density plasma CVD (HDPCVD) oxides can be thinned and planarized by the above disclosed slurry formulation. Silicides include tantalum silicide, titanium silicide and tungsten silicide.

When thinning and planarizing inter-layer dielectrics, it is desirable to remove by polishing, thinning and planarizing the dielectric thin film to render the film perfectly planar with low surface roughness and low scratch density and still have remaining excess dielectric material covering the gate structures and other conducting and semiconducting integrated circuit features. Further, when thinning and planarizing oxides are used for shallow trench isolation, it is desirable to polish back to either the CMP stop layer, typically a silicon nitride, or back to the epitaxial silicon or bulk silicon surface that is coplanar with the top of the oxide filled shallow trench.

Planarizing is accomplished by positioning the planarization composition described above between the pad and the surface coating of the wafer. In this embodiment, dielectric thin film with the dielectric surface is contacted with the pad wet with the aforementioned composition. The pad is rubbed against the second metal surface due to the rotation of the wafer.

The temperature for the thinning, polishing and planarizing operation will generally fall within a range from about 20° C. to about 80° C. Indeed, the operation is generally initially at about 20–50° C. but the temperature of the surface and the liquid carrier goes up as friction takes place.

Once the dielectric layer is sufficiently planarized, the surface can be subjected to further processing steps, including, but not limited to post-CMP surface cleans, photolithography, anisotropic plasma etching, and the application of barrier layers, metal plugs and vias. The metal plugs and vias typically comprise tungsten, aluminum or copper. The barrier layers are typically titanium, tantalum, tungsten, titanium nitride, tantalum nitride, tungsten nitride and titanium/tungsten.

The invention will be better understood by reference to the following illustrative experimental examples which demonstrate some of the compositions, methods of manufacture, methods of use, and advantages of the invention.

EXAMPLES

In the following Examples 1–4, methods for synthesizing slurries for CMP are described using alcoholic alkaline hydrolysis of the silica precursor, tetraethylorthosilicate (TEOS). The concentration of each starting material in each starting solution is included in parentheses. Other examples show the use of the slurries and methods of this invention to achieve improved polishing characteristics for dielectric thin films.

Example 1

Method 1 for Manufacturing Ethyl Silicate Slurry

1. Materials

Solution A: 73 milliliters (ml) 28% ammonium hydroxide ($NH_4OH$; concentration: 2.07 mol/l) 41 ml water ($H_2O$; concentration: 26.94 mol/1) 8 ml ethyl alcohol (ETOH; concentration: 0.16 mol/l)

Solution B: 46 ml TEOS; (final concentration: 1.92 mol/l).

2. Synthesis of Primary Particles a. Warm a beaker to 33° C. to 37° C.

b. Add solutions A and B dropwise over 15 minutes, with constant stirring at 280 rpm into beaker with the flow rate of A twice the flow rate of B.

c. remove from heat, stir, cool to 21.5° C. over 15 min.

3. Growth of Final Particles a. Warm solution to 35°–37° C. while adding dropwise with stirring: 250 ml TEOS and 394 ml $H_2O$.

b. Stir for 1.0 hours in a closed vessel.

c. Add 30 mnl TEOS dropwise every 30 minutes for a total of 3 additions.

d. Particle size: 160–180 nm.

4. Final Slurry Composition (weight percent of total)

a. 12.95% silica ($SiO_2$)

b. 2.0% $NH_3$ c. 40.35% ETOH d. 44.7% $H_2O$.

e. Particle size: 170±15 nanometers (nm; 8.8% standard deviation; "SD")

Example 2

Method 2 for Manufacturing Ethyl Silicate Slurry

1. Materials a. Solution A: 123 ml of 28% $NH_4OH$; (concentration: 6.96 mol/l) 60 ml $H_2O$; (concentration: 19.78 mol/l) 10 ml ETOH; (concentration: 0.31 mol/l)

b. SolutionB: 24 ml 28% $NH_4OH$ and 133 ml $H_2O$.

2. Synthesis of Primary Particles a. Pre-warm beaker to 33° C. to 37° C.

b. Add Solution A to beaker dropwise over 30 minutes along with 77 ml TEOS with constant stirring at 280 rpm and flow rate of Solution A being twice the flow rate of TEOS (final TEOS concentration, 1.59 mol/l).

3. Growth of Final Particles a. To the solution containing primary particles, add Solution B and 115 ml TEOS, both dropwise over 30 minutes, with constant stirring and with the flow rate of Solution B being twice that of the TEOS. After ⅔ of the TEOS has been added, the heat is turned off.

b. Stir for 1 hour more in a closed vessel.

| 4. Final Slurry Composition | |
|---|---|
| a. Silica: | 10.11%. |
| b. $NH_3$: | 7.23%. |
| c. ETOH: | 32.47%. |
| d. Water: | 50.19%. |
| e. Particle size: | 170 ± 22.5 nm (13% SD) |

Example 3

Method 3 for Manufacturing Ethyl Silicate Slurry for CMP

1. Materials a. Solution A: 147 ml $NH_4OH$, (concentration: 6.71 mol/l) 72 ml $H_2O$, (concentration: 19.38 mol/l) ml ETOH, (concentration: 0.36 mol/l)

b. SolutionB: 124 ml$H_2O$.

2. Synthesis of Primary Particles a. Pre-warm beaker to 33° C. to 37° C.

b. Add Solution A and 92 mnl TEOS over 15 minutes, stir at 280 rpm with the flow rate of Solution A being twice the flow rate of the TEOS solution. (final TEOS concentration: 1.65 mol/l)

c. Let cool while stirring, over 15 minutes to 21.5° C.

d. Particle size: 160–180 nm.

3. Growth of Final Particles a. Warm the solution containing primary particles to 33° C. to 37°. Cover 30 minutes while adding Solution B and 115 ml TEOS, with the flow rate of Solution B being twice the flow rate of the TEOS. Reduce the heat after ⅓ of the TEOS has been added.

b. Stir in a closed vessel for 1 hour.

c. Particle size: 160–180 nm.

| 4. Final Slurry Composition | |
|---|---|
| a. Silica: | 10.51%. |
| b. $NH_3$: | 6.97%. |
| c. ETOH: | 33.97%. |
| d. Water: | 48.55%. |

Example 4

Method 4 for Manufacturing Ethyl Silicate Slurry for CMP

1. Materials a. Solution A:
      850 ml $NH_4OH$, (concentration: 5.67 moth) 1,200 ml $H_2O$, (concentration: 17.32 mol/l)
      800 ml ETOH, (concentration: 3.55 mol/l)
      Mix at low speed.

b. Heat Solution A to 50° C.

2. Synthesis of Primary Particles a. Add 200 ml TEOS, stir on high for 15 minutes. (final TEOS concentration: 1.17 mol/l)

b. Stir for an additional 10 minutes.

3. Growth of Final Particles

Add 800 ml TEOS dropwise into vortex of stirred solution over 50 to 60 minutes at 50° C.

| 4. Final Slurry Composition | |
|---|---|
| a. Silica: | 7.65%. |
| b. $NH_3$: | 6.07%. |
| c. ETOH: | 41.22%. |
| d. Water: | 45.06%. |
| e. Particle size: | 100–140 nm. |

Example 5

Apparatus and Materials for Chemical Mechanical Polishing

Figure 1:
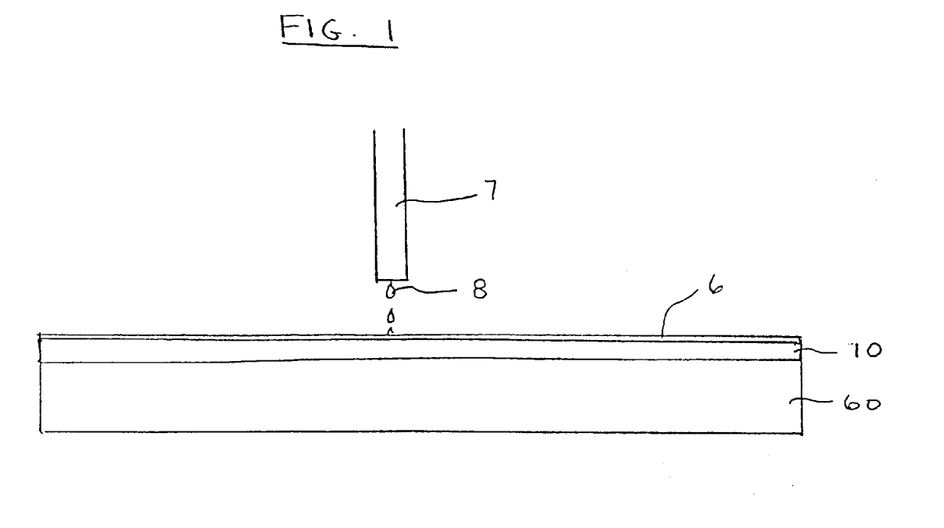
FIG. 1 illustrates a schematic view of a pad being wet by the planarization composition of the present invention.

The ethyl silicate slurries of this invention can be used to polish BPTEOS and thermal oxide dielectric materials. FIG. 1 illustrates a schematic view of a pad 10 being wet with the planarization composition 8 of the present invention. The planarization composition 8 forms a planarization composition thin film 6 on the top surface of the pad 10 to thereby wet the pad 10. A delivery system 7 brings the planarization composition 8 above the pad 10 which is located on a surface of the polishing platen 60. Another method of wetting the pad 10 includes a platen (not shown) having holes (not shown) from the top surface of the platen to the bottom surface of the platen. The planarization composition 8 would then be introduced from the bottom surface of the pad 10 through the bottom surface of the holed platen (not shown) to form a uniform planarization composition thin film. It is understood that either method to wet the pad 10 may be used, or any other method, that results in a pad 10 with a uniform planarization composition thin film.

Figure 2:
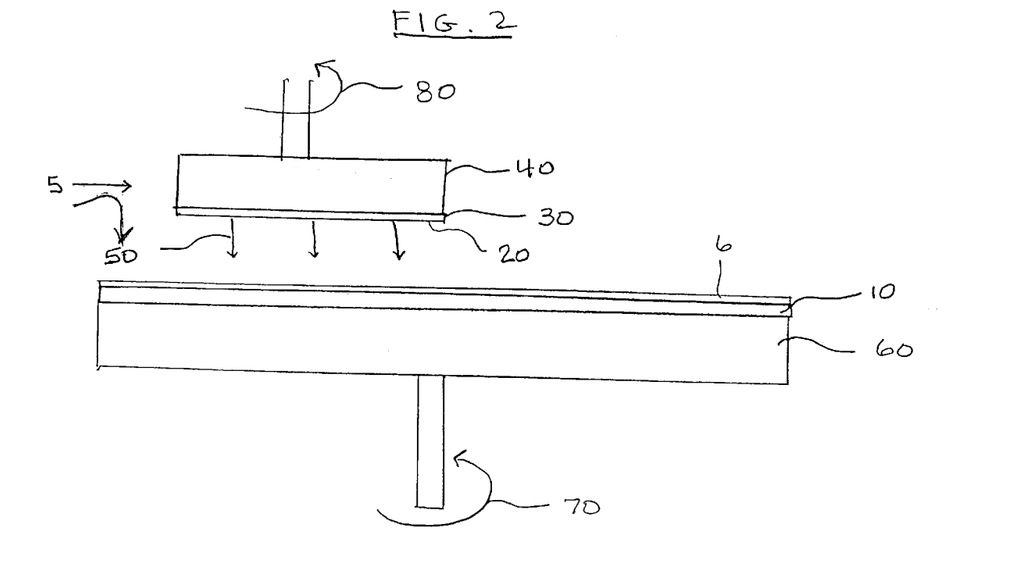
FIG. 2 illustrates a pad in accordance with the embodiment of the present invention wet by a composition in accordance with the present invention in position to thin, polish and planarize a hard flat surface layer from a partially fabricated integrated circuit.

FIG. 2 illustrates a schematic view of the pad 10 in accordance with an embodiment of the present invention wet by the planarization composition (not shown) to form the planarization film 6. The pad 10 is in a pre-rubbing position 5 before the pad 10 is used to thin, polish and planarize the hard flat surface layer 20 of a partially fabricated integrated circuit (not shown) on wafer 30. A quill 40, rotating in a wafer rotating direction 80, holds wafer 30 in the pre-rubbing position 5 to lower the quill 40 and wafer 30 in the rubbing direction 50 towards the pad 10. The pad 10 is supported by polishing platen 60 and rotates in a pad rotating direction 70.

Figure 3:
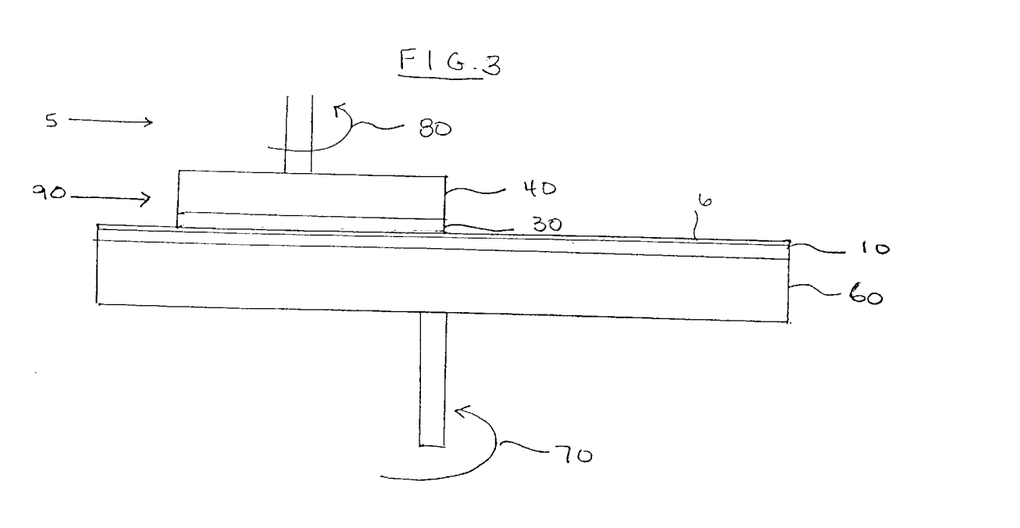
FIG. 3 illustrates the rubbing of the pad of FIG. 1 across the hard flat surface layer of FIG. 2 for providing the desired thinning, polishing and planarizing.

FIG. 3 illustrates a rubbing position 90 of the quill 40 and wafer 30 downwardly relative to the pre-rubbing position 5 of FIG. 2. In this rubbing position 90, the pad 10 wet with the planarization composition to form the planarization composition thin film 6 rubs against the hard flat surface layer 20 of the wafer 30 to provide the desired thinning, polishing and planarizing of the hard flat surface layer 20. The pad 10 has been wet by a planarization composition of this invention.

To demonstrate the effectiveness of the invention, a planarization composition comprising an ethyl silicate slurry was used, having the following physical and chemical characteristics:

| Slurry Composition | |
|---|---|
| pH | 11.1 |
| Weight % (NH$_4$OH) | 2.6 |
| Weight % SiO$_2$ | 13.1 |
| Particle size | 188 nm |
| Particle size distribution | 13.5% |

The above composition was used to polish semiconductor substrates, BPTEOS (12,000 Å thick), and thermal oxide (6,000 Å thick). The polishing pad was a Rodel model IC1000-A1 CMP device. The example comprises positioning the planarizing composition set forth above between a pad and the surface coating and rubbing the pad against the surface coating according to the following planarizing parameters:

| Polishing Conditions | |
|---|---|
| Downward Force | 9 psi |
| Back Pressure | 4 psi |
| Table Speed | 120 rpm |
| Quill Speed | 80 rpm |
| Planarizing Time | 50 seconds |

The amounts of material removed for BPTEOS and thermal oxide were 3,910 Å and 1,018 Å, respectively. The polishing rates for the above thin films were 4,887 Å and 1,272 Å per minute, respectively. Unexpectedly and surprisingly, the within wafer non-uniformities for BPTEOS and thermal oxide were less than 3.5% and surface roughness for both BPTEOS and thermal oxide were less than 6.0 Å. In contrast with these results, polishing using prior art slurries, resulted in root mean square surface roughness measurements of about 20 Å. Therefore, the compositions and methods of this invention improve the quality of planarization of dielectric films by about 3 fold. These surprising results were completely unexpected based upon the prior art compositions and methods.

Example 6

Use of Ethyl Silicate Slurries for Chemical Mechanical Polishing

A planarization composition was formed using an ethyl silicate slurry having an initial pH and weight percent for the SiO$_2$ abrasive and ammonium hydroxide as follows:

| Slurry Composition | |
|---|---|
| pH | 12.2 |
| Weight % NH$_4$OH | 9.0 |
| Weight % SiO$_2$ | 13.1 |
| Particle size | 188 nm |
| Particle size distribution | 13.5% |

The pH of the above composition was adjusted by stirring in a partially closed 30 gallon container at room temperature. With elapsed time, the pH of the composition was measured. Samples of the composition were taken at each pH from 12.2 to 11.1, and wafers having BPTEOS and thermal oxide were thinned and planarized. The polishing pad was a Rodel IC1000-A1/Suba IV. The example comprises positioning the planarizing composition set forth above between a pad and the surface coating and rubbing the pad against the surface coating according to the following planarizing parameters:

| Polishing Conditions | |
|---|---|
| Downward Force | 9 psi |
| Back Pressure | 4 psi |
| Table Speed | 120 rpm |
| Quill Speed | 80 rpm |
| Planarizing Time | 50 seconds |

The polishing rates achieved in this study are summarized in Table 2 below.

TABLE 2

Effect of Slurry pH on Polishing Rates and Planarity of Oxide Dielectric Materials

| pH | BPTEOS Polishing Rate (Å/min) | Thermal Oxide Polishing Rate (Å/min) |
|---|---|---|
| 12.2 | 2816 | 805 |
| 12.0 | 4150 | 1073 |
| 11.8 | 4463 | 1193 |
| 11.5 | 4354 | 1191 |
| 11.3 | 4526 | 1271 |
| 11.1 | 4772 | 1301 |

Example 7

Effects of Slurry pH on Polishing Rates and Planarization of Dielectric Films.

To determine the reproducibility of the polishing by slurries of the invention on planarization, we studied a total of 50 wafers as before, in Examples 5 and 6. A slurry with relatively low pH of the following composition was used:

| Slurry Composition | |
|---|---|
| pH | 11.1 |
| Weight % (NH₄OH) | 2.6 |
| Weight % SiO₂ | 13.1 |
| Particle size | 188 nm |
| Particle size distribution | 13.5% |

The polishing pad was a Rodel IC1000-A1/Suba IV. The study comprised positioning the planarizing composition set forth above between a pad and the surface coating of CVD oxide and rubbing the pad against the surface coating according to the following planarizing conditions:

| Polishing Conditions | |
|---|---|
| Downward Force | 9 psi |
| Back Pressure | 4 psi |
| Table Speed | 120 rpm |
| Quill Speed | 80 rpm |
| Planarizing Time | 50 seconds |

50 wafers were thinned and planarized as described. The results obtained for every fifth wafer so treated are shown in Table 3.

TABLE 3

Reproducibility of Planarization of Dielectric Materials by Ethyl Silicate Slurry

| Wafer No. | Removal Rate (Å/min) | Within Wafer Non-Uniformity (%) | Surface Roughness (Ra) |
|---|---|---|---|
| 1 | 4244 | 2.9 | 12 |
| 5 | 4436 | 2.6 | 8.3 |
| 10 | 4600 | 3.0 | 11 |
| 15 | 4843 | 2.8 | 10 |
| 20 | 4914 | 4.5 | 9.7 |
| 25 | 4848 | 3.6 | 8.1 |
| 30 | 4841 | 3.7 | 8.8 |
| 35 | 4732 | 3.6 | 13 |
| 40 | 4696 | 3.0 | 8 |
| 45 | 4543 | 3.8 | 12 |
| Mean | 4670 | 3.4 | 9.3 |
| SD | 203 | 0.6 | 3.5 |

The results of Table 3 indicates that the planarization using the slurry of the invention is highly reproducible, with standard deviations (SD) from the mean for the removal rate, within wafer non-uniformity, and surface roughness being 4.3%, <18%, and about 31%, respectively. Although the variability of the within wafer non-uniformity and surface roughness are higher than the variability of the removal rate, the within wafer non-uniformity and surface roughness are substantially lower than the results obtained using prior art slurries.

In contrast with these results, polishing with prior art slurries resulted in root mean square surface roughness measurements of about 20 Å. Thus, the compositions and methods of this invention improve the quality of planarization of dielectric films by about 3 fold. These surprising results were completely unexpected based upon the prior art compositions and methods.

Example 8

Manufacture of Low Alcohol Planarization Compositions

To produce alkosol planarization compositions with reduced alcohol content, a TEOS based silica sol containing a high (35%–40%) ethanol content was first produced, by way of example only, using the methods of Examples 1–4, and then was subjected to an ultrafiltration (UF) process. The UF process removed the excess alcohol and the excess ammonium hydroxide.

A suction side of a pump capable of operating in a flammable materials environment was connected to the source vessel of TEOS-based alkosol slurry. The outlet of the pump was connected to an UF unit. The UF unit was manufactured by Graver Co. It is desirable to use a UF system which is resistant to corrosion by the chemicals used. The Graver UF system is made of titanium oxide and type 316 stainless steel, which is resistant to corrosion, and is relatively non-contaminating.

The slurry was pumped at a temperature of between about 20° C. and about 80° C. into the ultrafiltration unit and was recirculated back into the supply vessel. Higher temperatures allow the UF process to work more efficiently. Filtrate (permeate) consisting of a mixture of ethanol, ammonium hydroxide, and water was captured and measured for volume as it exited the UF unit. The recirculation and ultrafiltration processes were allowed to continue until the solids concentration increased from an initial 10%–15% to a predetermined, final concentration, typically about 30%. As the solids concentration increased, the rate of filtrate production decreased. Deionized (DI) water was added back to the source vessel to dilute the slurry to a pre-determined initial concentration. Recirculation and ultrafiltration continued until the final solids concentration level is reached, whereupon the cycle was repeated.

When the ethanol concentration reached about 4%, the pump was stopped, and the slurry product was diluted to the final concentration using 3% ammonium hydroxide solution.

Slurries of differing alcohol and ammonium hydroxide concentrations were made and tested to determine the polishing rates and within-wafer non-uniformity.

Example 9

Effect of Alcohol Concentration on Polishing Rates

To determine the effects of alcohol concentration on removal rates of compositions of this invention, we studied three planarization compositions, A, B, and C with the following compositions and observed removal rates. Thermal oxide wafers were polished using Rodel IC 1400-A1 polishing pad, and a Strasbaugh 6EC CMP tool. The downward force was 8 psi, the table and quill speeds were 150 and 30 rpm, respectively. The slurry flow rate was 200 ml/min at a set point temperature of 25° C.

| Slurry Compositions | A | B | C |
|---|---|---|---|
| pH | 11.16 | 10.97 | 11.02 |
| Ethanol (weight %) | 5.72 | 6.9 | 2.1 |
| Weight % SiO₂ | 12.9 | 12.0 | 13.4 |
| Particle size (nm) | 171 | 185 | 178 |
| Polishing Rate (Å/min) | 2731 | 3255 | 3867 |

Comparing these results with those of Example 5 show that with high alcohol concentration, the removal rates are lower (1,272 Å/mm) than those obtained using compositions with lower alcohol concentrations.

Example 10

Planarization Rates and Wafer Uniformity Using Low Alcohol Compositions

Figure 4:
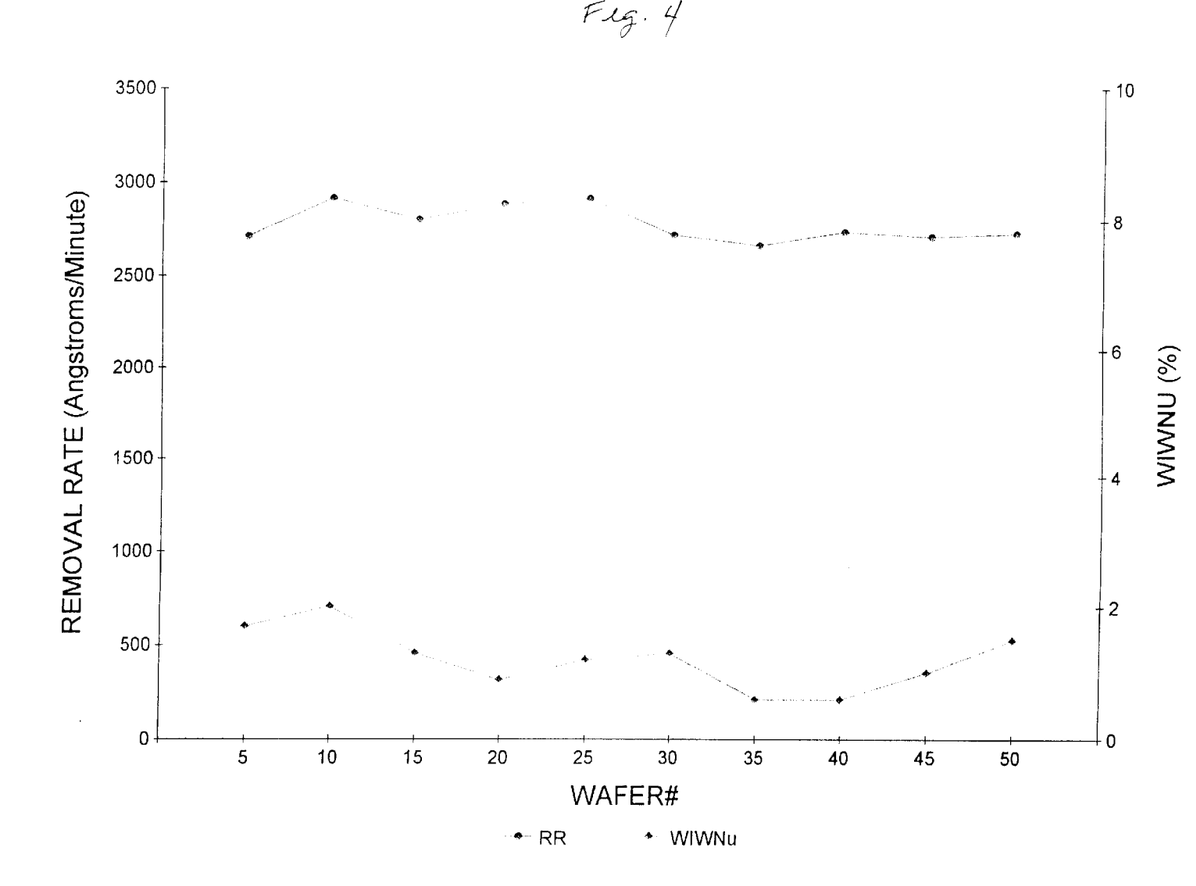
FIG. 4 is a graph depicting polishing rates and within-wafer non-uniformity of polishing thermal oxide wafers using low alcohol compositions of the invention.

To determine the planarization rates and wafer uniformity obtained using low alcohol compositions of the invention, we polished 50 thermal oxide wafers using a composition with ethanol concentrations below 7 weight %. The results are shown in FIG. 4 shows the removal rates (in Å/min) and within-wafer non-uniformity (%) of polishing thermal oxide wafers with the low alcohol planarization compositions of this invention. Fifty wafers were polished, and every fifth was studied. Polishing rates were between 2500 Å/min and 3000 Å/min, which were significantly higher than the polishing rates obtained with high alcohol compositions. Additionally, the within-wafer non-uniformity was below 2%, which is substantially lower than the wafer non-uniformity observed with high alcohol compositions shown in Table 3.

Therefore, the low alcohol compositions provide higher polishing rates and lower within-wafer non-uniformity than the higher alcohol compositions.

Example 11

Figure 5:
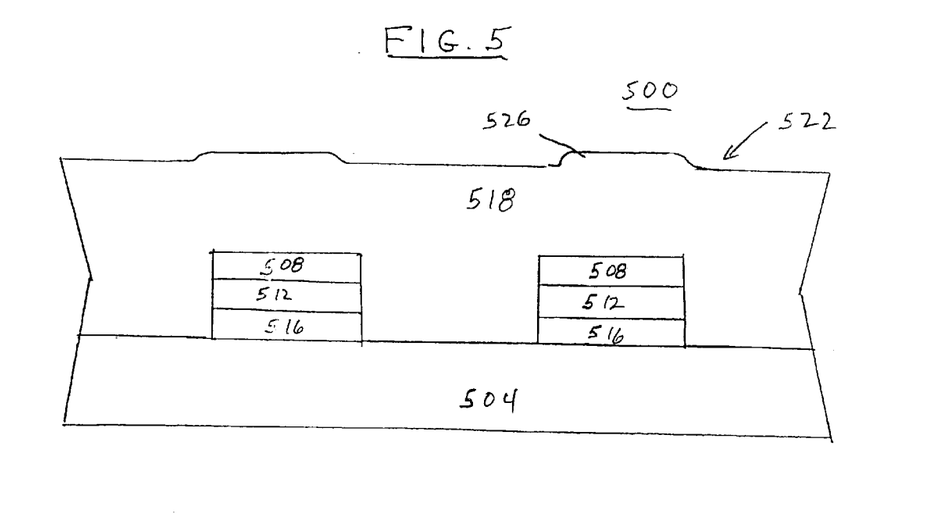
FIG. 5 is a cross-sectional view illustrating a sample semiconductor device manufactured using the method for manufacturing gate structure and inter-layer dielectrics before planarization of the present invention.

Semiconductor Devices Manufactured Using the Planarization Compounds of the Invention FIG. 5 illustrates an embodiment of the present invention depicting a cross-sectional view of a sample semiconductor device 500 made using the method for manufacturing gate structure and inter-layer dielectrics of the present invention before the dielectric film surface has been planarized using the method and composition of the present invention. Layers of gate oxide 516, polysilicon 512 and tungsten silicide 508 are deposited sequentially on top of substrate layer 504. The dielectric film layer 518 has surface 522 with irregularities 526 which are responsible for surface roughness.

Figure 6:
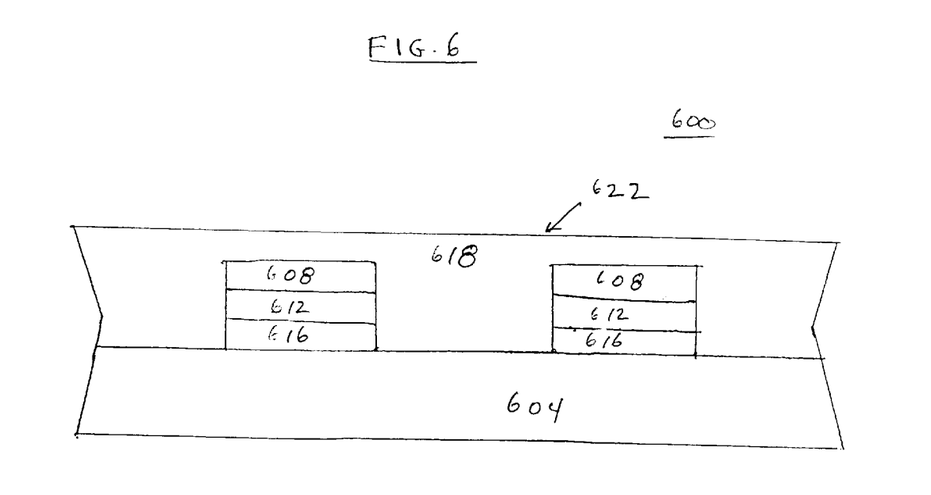
FIG. 6 is a cross-sectional view illustrating a sample semiconductor device using the method for manufacturing gate structure and inter-layer dielectrics after planarization of the present invention.

FIG. 6 illustrates an embodiment of the present invention depicting a cross-sectional view of a sample semiconductor device 600 made using the method for manufacturing gate structure and inter-layer dielectrics of the present invention after the dielectric film surface has been planarized using the method and composition of the present invention. Layers of gate oxide 616, polysilicon 612 and tungsten silicide 608 are deposited sequentially on top of substrate layer 604. The dielectric film layer 618 has surface 622 without surface defects.

Figure 7A:
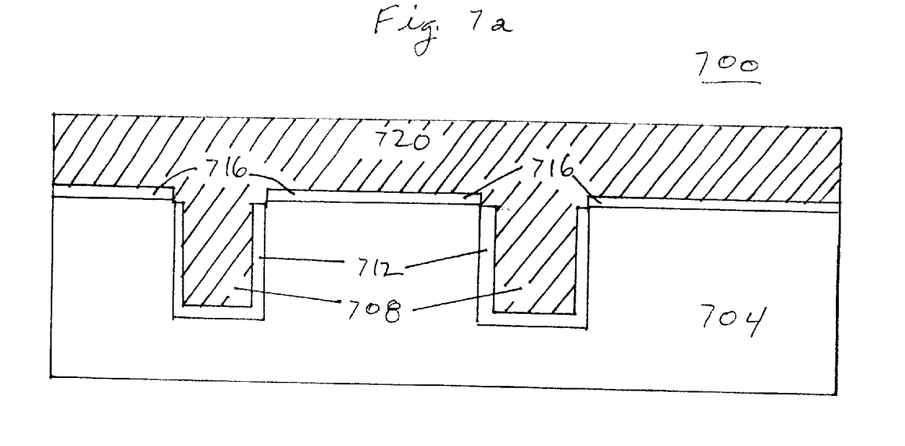
FIG. 7a is a depiction of a shallow trench isolation before CMP.
Figure 7B:
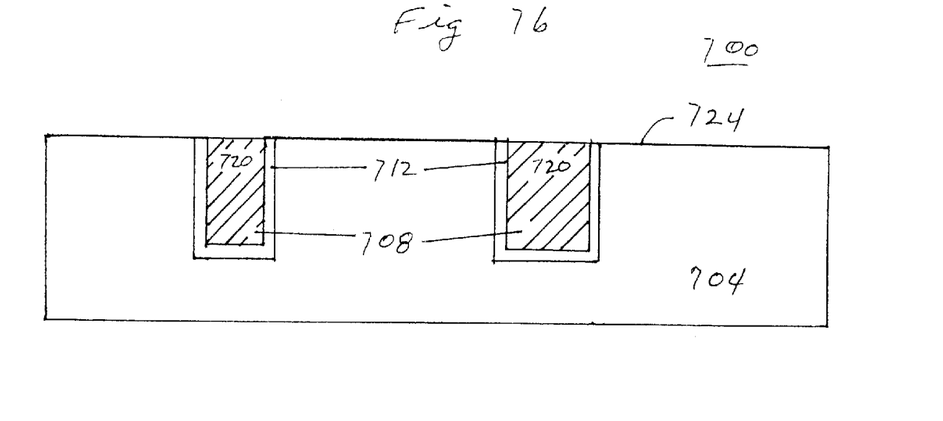
FIG. 7b is a depiction of a shallow trench isolation after CMP of this invention.

FIGS. 7a and 7b illustrate the planarization of shallow trench isolations 700 of the invention. FIG. 7a shows substrate 704 made of bulk Si or epitaxial silicon with shallow trenches 708. A layer of thermal oxide 712 is deposited in the shallow trenches, and optionally, a nitride stop layer 716 is deposited on the top of the substrate 704. A layer of high density plasma oxide 720 is deposited to fill the shallow trenches 708 and cover the nitride stop layer 716.

FIG. 7b shows a similar structure 700 as in FIG. 7a, but with the surface subjected to CMP of this invention. The substrate 704 has shallow trenches 708 with thermal oxide layers 712. The trenches are filled with high-density plasma oxide 720, and the upper surface 724 is planarized and polished according to the invention, and finally the nitride layer is removed by phosphoric acid treatment.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

INDUSTRIAL APPLICABILITY

The present invention provides compositions for chemical mechanical planarization and methods of using the compositions to remove interlayer dielectric materials from the surfaces of semiconductor wafers following deposition of thin films such as tungsten silicide/polysilicon/gate structures or titanium/aluminum/titanium nitride stacks. Advantageously, the method of the present invention provides a interlayer dielectric surface that has less surface roughness, is higher purity and reduces scratch density. The present invention also provides articles of manufacture such as semiconductor devices made incorporating the improved planarization methods. The improvements in the planarity of semiconductor devices is extremely important to the semiconductor industry wherein extreme precision and surface cleanliness on a nanometer scale is essential to the manufacture of high density semiconductor devices, with high manufacturing throughput.

We claim:

1. A planarization composition having a pH from about 9 to about 11.5, comprising an alkosol comprising:
   spherical, monodisperse alkylsilicate particles, in that at least about 90 weight % of the particles have diameters which are no more than about 20% different from the weight average diameter, and
   a liquid carrier comprising:
      an alcohol, in the range of about 0 weight % to about 9 weight %,
      a base, and
      the remainder, water.

2. The planarization composition of claim 1, wherein the spherical alkylsilicate particles have diameters in the range of about 30 nm to about 400 nm.

3. The planarization composition of claim 1, wherein the monodispersity of the alkylsilicate particles is such that at least about 90 weight % of the particles have diameters which are no more than about 15% different from the weight average diameter.

4. The planarization composition of claim 1, wherein the alkylsilicate particles are present in amounts ranging from about 0.5 weight % to about 30 weight %.

5. The planarization composition of claim 1, wherein the base is selected from the group consisting of potassium hydroxide, and an amine hydroxide selected from the group consisting of ammonium hydroxide, $NR_4OH$ and $NR_2NR_3OH$, wherein each R is independently selected from the group consisting of H, $CH_3$, $CH_2CH_3$, $C_3H_7$, and $C_4H_9$.

6. The planarization composition of claim 5, wherein the hydroxyl amine concentration is in the range of about 0.2 weight % to about 9 weight %.

7. The planarization composition of claim 5, wherein the hydroxyl amine concentration is in the range of about 0.2 weight % to about 4 weight %.

8. The planarization composition of claim 1, wherein the pH is adjusted by adding at least one of an acid selected from the group consisting of nitric, sulfuric, hydrochloric, carboxylic, acetic, citric, acetylsalicylic, and dicarboxylic acids.

9. The planatization composition of claim 1, wherein the pH is adjusted by controlling the concentration of at least one of said base.

10. The planarization composition of claim 1, wherein the total dissolved metal content is no more than about 20,000 parts per billion.

11. The planarization composition of claim 1, wherein the total dissolved metal content is no more than about 2000 parts per billion.

12. The planarization composition of claim 1, wherein the total dissolved metal content is no more than about 500 parts per billion.

13. The planarization composition of claim 1, wherein the concentration of at least one of said alcohol and said base is adjusted after the formation of said particles.

14. The planarization composition of claim 1, wherein the concentration of at least a base is adjusted after the formation of said particles.

15. The planarization composition of claim 1, wherein the concentration of a first base is decreased after the formation of said particles, and the concentration of a second base is increased after the formation of said particles.

16. The planarization composition of claim 1, wherein the planarization rates on borophosphoroustetraethylorthosilicate glass (BPTEOS) are in the range of about 500 Å per min to about 15,000 Å per min., under polishing conditions which include downforce: 9 psi, back pressure: 4 psi, table speed: 120 rpm and quill speed: 80 rpm.

17. The planarization composition of claim 16, wherein the planarization rates on borophosphoroustetraethylorthosilicate glass (BPTEOS) are in the range of about 3000 Å per min to about 15,000 Å per min.

18. The planarization composition of claim 16, wherein the planarization rates on thermal oxide are in the range of about 500 Å per min to about 10,000 Å per min.

19. The planarization composition of claim 1, wherein the pH of said composition is in the range of about 10 to about 11.5.

20. The planarization composition of claim 1, wherein the pH of said composition is in the range of about 10 to about 11.

21. The planarization composition of claim 1, wherein the root mean square surface roughness of a planarized surface is less than about 20 Å, under polishing conditions which include downforce: 9 psi, back pressure: 4 psi, table speed: 120 rpm and quill speed: 80 rpm.

22. The planaization composition of claim 21, wherein the root mean square surface roughness of a planazized surface is less than about 10 Å.

23. The planarization composition of claim 16, wherein the root mean square surface roughness of a planarized surface is less than about 5 Å.

24. The planarization composition of claim 1, wherein the particles are synthesized from a tetraallylsitoxane.

25. The planarization composition of claim 1, wherein the particles are synthesized from a tetraalkylsiloxane, wherein said tetraalkylsiloxane comprises alkyl moieties selected independently from the group consisting of methyl, ethyl, butyl, isobutyl, propyl, and isopropyl moieties.

26. The planarization composition of claim 1, wherein the particles are synthesized from tetraethylorthosilicate (TEOS).

27. The planarization composition of claim 1, wherein the monodispersity of the particles is such that at least about 90 weight % of the particles have diameters which are no more than about 10% different from the weight average diameter.

28. The planarization composition of claim 1, wherein said alcohol concentration is below about 4 weight %.

29. The planarization composition of claim 1, wherein said alcohol concentration is below about 3 weight %.

30. The planarization composition of claim 1, wherein said alcohol concentration is below about 2 weight %.

31. The composition of claim 1, wherein at least about 90 weight % of the particles have diameters which are no more than about 20% different from the weight average diameter, and said alcohol concentration is below about 7 weight %.

32. The composition of claim 1, wherein at least about 90 weight % of the particles have diameters which are no more than about 15% different from the weight average diameter, and said alcohol concentration is below about 7 weight %.

33. The composition of claim 1, wherein at least about 90 weight % of the particles have diameters which are no more than about 10% different from the weight average diameter, and said alcohol concentration is below about 7 weight %.

34. The composition of claim 1, wherein at least about 90 weight % of the particles have diameters which are no more than about 20% different from the weight average diameter, and said alcohol concentration is below about 4 weight %.

35. The composition of claim 1, wherein at least about 90 weight % of the particles have diameters which are no more than about 15% different from the weight average diameter, and said alcohol concentration is below about 4 weight %.

36. The composition of claim 1, wherein at least about 90 weight % of the particles have diameters which are no more than about 10% different from the weight average diameter, and said alcohol concentration is below about 4 weight %.

37. The composition of claim 1, wherein at least about 90 weight % of the particles have diameters which are no more than about 15% different from the weight average diameter, and said alcohol concentration is below about 3 weight %.

38. The composition of claim 1, wherein at least about 90 weight % of the particles have diameters which are no more than about 15% different from the weight average diameter, and said alcohol concentration is below about 3 weight %.

39. The composition of claim 1, wherein at least about 90 weight % of the particles have diameters which are no more than about 10% different from the weight average diameter, and said alcohol concentration is below about 3 weight %.

40. The composition of claim 1, wherein at least about 90 weight % of the particles have diameters which are no more than about 20% different from the weight average diameter, and said alcohol concentration is below about 2 weight %.

41. The composition of claim 1, wherein at least about 90 weight % of the particles have diameters which are no more than about 15% different from the weight average diameter, and said alcohol concentration is below about 2 weight %.

42. The composition of claim 1, wherein at least about 90 weight % of the particles have diameters which are no more than about 10% different from the weight average diameter, and said alcohol concentration is below about 2 weight %.

43. A planarization composition having a pH from about 9 to about 11.5, comprising an alkosol comprising:

from about 0.5 weight % to about 30 weight % of spherical alkylsilicate and silica particles having a weight average particle diameter in the range of about 30 nm to about 400 nm, and is mono-disperse in that at least about 90 weight % of the particles have diameters which are no more than about 20% different from the weight average diameter, and a liquid carrier comprising:
an alcohol, in the range of about 0 weight % to about 9 weight %,
at least one base selected from the group consisting of potassium hydroxide and an amine hydroxide selected from the group consisting of ammonium hydroxide, $NR_4OH$ and $NR_2NR_3OH$, wherein each R is independently selected from the group consisting of H, $CH_3$, $CH_2CH_3$, $C_3H_7$, and $C_4H_9$ in an amount in the range of about 0.2 weight % to about 9.0 weight %, and
the remainder water.

44. A method for manufacturing an alkosol planarization composition, comprising:

hydrolyzing an tetraalkylsiloxane precursor in a solution
comprising:
at least one alcohol, in an amount in the range of about 30 weight % to about 45 weight %,
at least one base, such that the pH of the solution is in the range of about 7 to about 11.5,
the remainder, water,
allowing the hydrolyzed tetraalkylsiloxane precursor to form spherical alkylsilicate ad silica particles having at least about 90 weight % of the particles with diameters which are no more than about 20% different from the weight average diameter,
adjusting, after the formation of said alkylsilicate and silica particles, the concentration of said alcohol to below about 9 weight %, and optionally,
adjusting at least one of the pH and the concentration of at least one of said base after the formation of said particles.

45. The method of claim 44, wherein the at least one base is selected at least one base selected from the group consisting of potassium hydroxide and an amine hydroxide selected from the group consisting of ammonium hydroxide, $NR_4OH$ and $NR_2NR_3OH$, wherein each R is independently selected from the group consisting of H, $CH_3$, $CH_2CH_3$, $C_3H_7$, and $C,H_9$.

46. The method of 45, wherein the concentration of at least one of said base is in the range of about 0–2 weight % to about 9 weight %.

47. The method of claim 44, wherein said alcohol concentration is adjusted to below about 4 weight %.

48. The method of claim 44, wherein said alcohol concentration is adjusted to below about 3 weight %.

49. The method of claim 44, wherein said alcohol concentration is adjusted to below about 2 weight %.

50. A method for manufacturing an alkosol planarization composition, comprising:
hydrolyzing an tetraalkylsiloxane precursor in a solution comprising:
at least one alcohol, in an amount in the range of about 30 weight % to about 45 weight %,
at least one base selected from the group consisting of potassium hydroxide and an amine hydroxide selected from the group consisting of ammonium hydroxide, $N_4OH$ and $NR_2NR_3OH$, wherein each R is independently selected from the group consisting of $H_2CH_3$, $CH_2CH_3$, $C_3H_7$, and $C_4H_9$ in an amount in the range of about 0.2 weight % to about 9.0 weight %, and
the remainder water, wherein the pH of the solution is between about 9 and about 11.5,
allowing the hydrolyzed tetraalkylsiloxane precursor to form spherical alkylsilicate and silica particles having at least about 90 weight % of the particles with diameters which are no more than about 20% different from the weight average diameters
adjusting the alcohol to below about 9 weight %; and optionally,
adjusting at least one of the pH, and a base of the planarization composition.

51. The method of claim 50, wherein the pH of said composition is adjusted to the range of about 10 to about 11.5.

52. The method of claim 31, wherein the pH of said composition is adjusted to the range of about 10.5 to about 11.

53. The method of claim 50, additionally comprising adjusting the content of at least one of an alcohol to below about 7 weight % and a base in the planarization composition after the formation of said particles.

54. The method of claim 53, wherein the method for adjusting the content of an alcohol in the planarization composition after the formation of said particles is selected from the group consisting of evaporation and ultrafiltration.

55. The method of claim 53, wherein the concentration of a first base consisting of an amine hydroxide is reduced, and the concentration of a second base is increased.

56. The method of claim 53, wherein the method for adjusting the content of an alcohol is ultrafiltration.

57. The method of claim 56, wherein the ultrafiltration is accomplished using apparatus, wherein surfaces of said apparatus exposed to planarization chemicals comprise materials selected from the group of stainless steel and titanium oxide.

58. The method of claim 57, wherein the stainless steel is type 316 stainless steel.

59. The method of claim 56, wherein the temperature of the ultrafiltration apparatus is in the range of about 20° C. to about 80° C.

* * * * *